United States Patent [19]

Cachier et al.

[11] 4,278,951
[45] Jul. 14, 1981

[54] SOLID-STATE MILLIMETER WAVE SOURCE COMPRISING A DIRECTIVE ANTENNA

[75] Inventors: Gérard Cachier; Jacques Espaignol, both of Paris, France

[73] Assignee: Thomson-CSF, Paris, France

[21] Appl. No.: 24,503

[22] Filed: Mar. 28, 1979

[30] Foreign Application Priority Data

Mar. 31, 1978 [FR] France .................. 78 09568

[51] Int. Cl.³ .............................................. H03B 5/36
[52] U.S. Cl. ............................. 331/96; 331/107 DP
[58] Field of Search ............... 343/100 PE, 756, 772, 343/909; 331/21 A, 233, 96, 107 DP

[56] References Cited

U.S. PATENT DOCUMENTS

| 3,858,213 | 12/1974 | Tellier et al. ............... 343/100 PE |
| 3,869,681 | 3/1975 | Klein et al. ................... 331/96 |
| 3,878,480 | 4/1975 | Hulderman et al. ............. 331/96 |

FOREIGN PATENT DOCUMENTS

| 932914 | 7/1963 | United Kingdom . |
| 1006325 | 9/1965 | United Kingdom . |
| 1216880 | 12/1970 | United Kingdom . |
| 1325459 | 8/1973 | United Kingdom . |
| 1352090 | 5/1974 | United Kingdom . |
| 1373736 | 11/1974 | United Kingdom . |
| 1379827 | 1/1975 | United Kingdom . |
| 1427240 | 3/1976 | United Kingdom . |
| 1514840 | 6/1978 | United Kingdom . |

OTHER PUBLICATIONS

L. S. Bowman et al., *Oscillation of Silicon PN Junction Avalanche Diodes in the 50 to 140 GHZ Range*, Proceedings of the 1EEE, vol. 34, No. 8, pp. 1080-1081, Aug. 1966.

*Primary Examiner*—Theodore M. Blum
*Attorney, Agent, or Firm*—Oblon, Fisher, Spivak, McClelland & Maier

[57] ABSTRACT

A source of millimeter waves adjustable in power and frequency and embodied as a cylindrical waveguide one end of which is provided with a movable piston and the other end with a directive antenna generally a radiating horn. Between the ends is tapped a cylindrical waveguide branch in which slides a sub-assembly carrying a radiating module containing an oscillating diode. The position of the module affects the power and the frequency of oscillation of the source and the position of the movable piston acts on the power emitted by the radiating horn.

4 Claims, 2 Drawing Figures

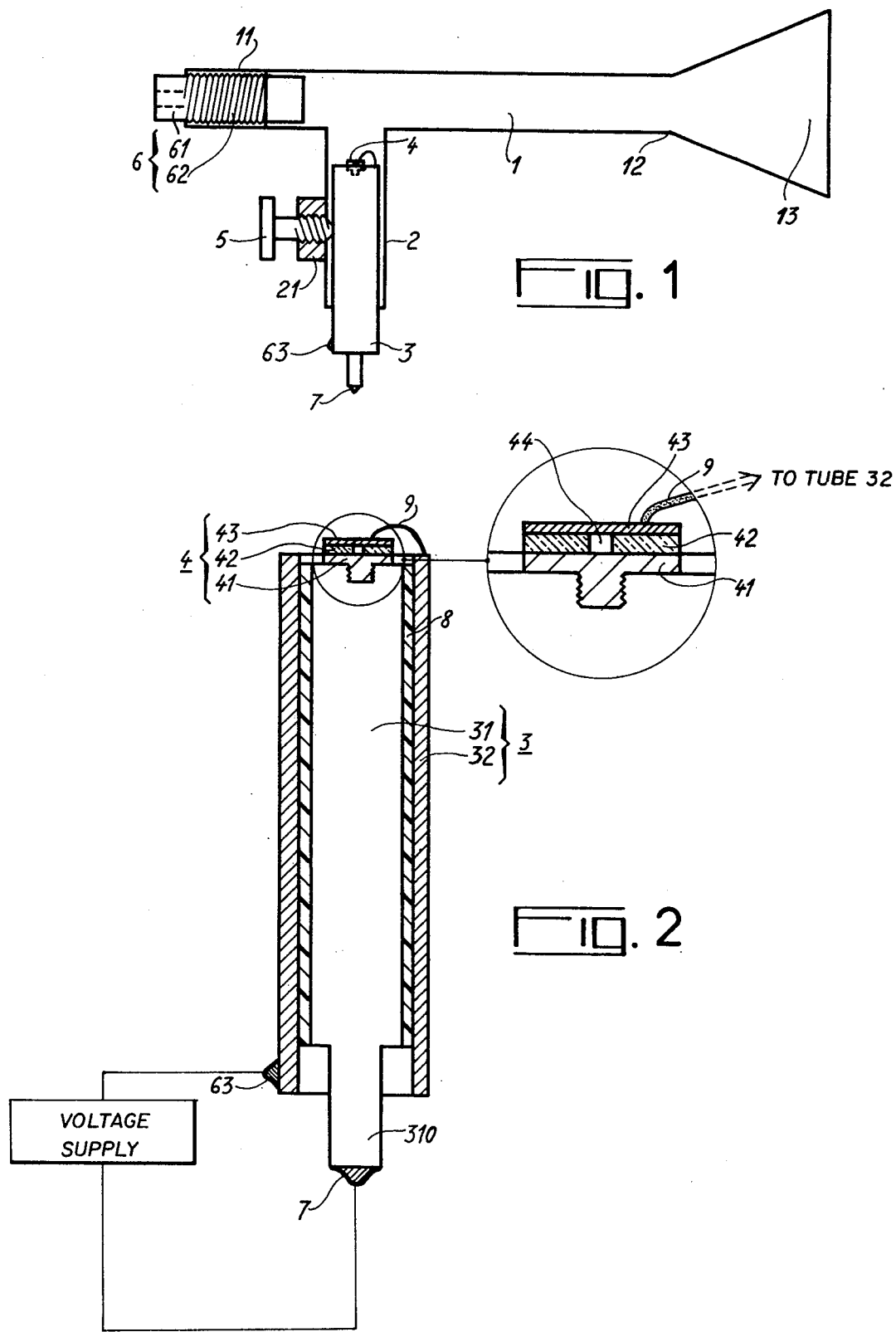

SOLID-STATE MILLIMETER WAVE SOURCE COMPRISING A DIRECTIVE ANTENNA

The invention relates to a solid-state millimeter wave source comprising a directive antenna.

Embodiments of such sources are known that comprise a cylindrical waveguide in the entrance of which a plug supporting the active component is screwed until an electrode of the active component comes in contact with a conductor which extends through the walls of the guide by way of insulated passages. Optionally, the plug may have an opening allowing a connection to enter the guide so that the aforementioned conductor can be dispensed with.

The invention provides a mechanically simpler arrangement and additional possibilities of adaptation of an active component to a waveguide section and of adaptation of the waveguide section to a directive antenna.

The arrangement utilises a module i.e. an electronic component comprising a thermally and electrically conductive support, a semiconductive diode one electrode of which is in contact with this support, and which is the aforementioned active component, a layer of dielectric being deposited onto the support so as to surround the diode and a metallisation being deposited on the assembly so as to be in contact with the other electrode of the diode.

According to the invention there is provided a source of millimeter waves comprising a cylindrical waveguide one end of which is provided with a movable piston and the other end is provided with a directive antenna, and, connected to the section between the ends, a cylindrical waveguide branch, a solid-state active component integrated in a module having a metal support and an electrode, the latter being capable of radiating the millimeter waves emitted by the active component, said module being supported by a sub-assembly slidable in said branch, the adjustment of the piston and the sub-assembly being usable for acting on the power and the frequency of said source.

The invention will be understood better, and other features will be apparent, from the ensuing description with reference to the accompanying drawings in which:

FIG. 1 shows an embodiment according to the invention;

FIG. 2 shows a sub-assembly of the embodiment of FIG. 1.

FIG. 1 shows a circular waveguide 1 provided with a branch 2 also in the form of a circular guide, this branch being connected to the guide 1 to be perpendicular thereto and in the vicinity of one of the ends 11.

Connected at the other end 12 is a horn 13 in the shape of a truncated cone adapted to perform the function of a directive antenna.

A positioning part 3, which supports a module 4 and connecting terminals 63 and 7 for connection to a source of power for the module 4, slides in the guide portion formed by the branch 2. The part 3 may be immobilized by tightening a screw 5, the screw thread of which is engaged in a tapped sleeve 21 welded to the branch 2.

A screw-threaded plug 6 is inserted in a tapped part of the end 11 of the guide 1. It has a head 61 of smaller diameter than the screw-threaded part 62 of the plug 6 so as to be capable of entering the guide in the manner of a movable piston.

FIG. 2 shows the sub-assembly formed by the part 3 and the module 4. The part 3 has a central core which is none other than a solid cylinder of copper 31; it also has metal sleeve for example a copper tube 32 insulated from the cylinder 31 by a layer of adhesive 8 which has a high dielectric resistivity and a low thermal resistance for example an adhesive constituted by epoxy resin filled with boron nitride.

The module 4 is formed by a diode having a negative resistance, for example an avalanche diode 44 mounted on a cylindrical-base support 41 of a metal which is a good conductor of both heat and electricity, the support having a screw-threaded fixing spigot inserted in a tapped hole of the solid cylinder 31. Placed above the base 41 is a dielectric disc 42 which bears on the cylinder and surrounds the diode. The disc is covered with a metal layer 43 constituting an electrode. This electrode is connected to the tube 32 by a connection 9 which is soldered to the latter and to the electrode 43. A similar connection can be found in FIG. 1 of a published article by Bowman et al entitled "*Oscillation of Silicon pn Junction Avalanche Diodes in the* 50 to 140 GHz Range" and appearing in Proceedings of the IEEE, Vol. 34, No. 8, pages 1080–1081 August 1966.

The terminals for connection to the source of power are, for example, deposits of solder 63 and 7 which respectively adhere to the outer surface of the tube 32 and to the end of a rod 310 which extends from the cylinder 31 at the end thereof opposed to the module 4.

The operation of the source of millimeter waves thus constructed is regulated by:

1. Acting on the position of the part 3, that is to say, the position of the module 4 in the branch 2, which affects the power and the frequency of oscillation of the source.

2. Acting on the position of the plug 6, that is to say, on the movable piston, which acts on the power emitted by the horn 13 (and also on the frequency).

The heat energy given off by the module 4 is dissipated mainly by way of the part 3 owing to the low thermal resistance of the adhesive 8 and of the parts interconnected thereby.

We claim is:

1. A source of millimeter waves comprising a cylindrical waveguide one end of which is provided with a movable piston and the other end is provided with a directive antenna, and, connected to the section between the ends, a cylindrical waveguide branch, a solid-state active component integrated in a module having a metal support and an electrode, the latter being capable of radiating the millimeter waves emitted by the active component, said module being supported by a sub-assembly slidable in said branch, said sub-assembly having a central part supporting said solid state component that is insulated from said waveguide branch, and a voltage supply inserted between said central part and said waveguide branch, the adjustment of the piston and the sub-assembly being usable for acting on the power and the frequency of said source.

2. A source as claimed in claim 1, wherein the directive antenna is a horn.

3. A source as claimed in claim 1, wherein the directive antenna has the shape of a truncated cone.

4. A source as claimed in claim 1, wherein said metal sleeve is a copper tube and said material insulating the same from the core is an adhesive constituted by an epoxy resin filled with boron nitride.

* * * * *